(12) United States Patent
Urushiyama

(10) Patent No.: US 6,456,109 B2
(45) Date of Patent: Sep. 24, 2002

(54) JITTER DETECTING CIRCUIT FOR DETECTING CYCLE-TO-CYCLE JITTER

(75) Inventor: Kenji Urushiyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/836,688

(22) Filed: Apr. 17, 2001

(30) Foreign Application Priority Data

Apr. 20, 2000 (JP) ........................................ 2000-118966

(51) Int. Cl.[7] .............................................. H03K 19/00
(52) U.S. Cl. .............................. 326/38; 326/93; 326/99; 326/46
(58) Field of Search ............................. 326/37, 38, 46, 326/93–99; 327/12

(56) References Cited

U.S. PATENT DOCUMENTS 5,926,041 A * 7/1999 Duffy et al. ................... 327/12
6,259,278 B1 * 7/2001 Huang ........................... 327/12
6,351,508 B1 * 2/2002 Shishkoff et al. ............. 327/163

FOREIGN PATENT DOCUMENTS

JP          7-50926          5/1995          ............ H04N/5/95

* cited by examiner

Primary Examiner—Don Phu Le
(74) Attorney, Agent, or Firm—Michael Best & Friedrich LLC; J. Warren Whitesel

(57) ABSTRACT

A jitter detecting circuit firstly compares a target signal with a reference clock signal to see whether or not a phase difference takes place between the target signal and the reference clock signal, and, thereafter, the phase difference in each clock cycle is compared with the phase difference in the previous clock cycle for producing a detecting signal representative of cycle-to-cycle jitter when the phase difference is varied.

38 Claims, 13 Drawing Sheets

JITTER DETECTING CIRCUIT FOR DETECTING CYCLE-TO-CYCLE JITTER

FIELD OF THE INVENTION

This invention relates to a jitter detecting circuit for detecting jitter contained in a clock signal generated by an oscillating circuit and, more particularly, to a jitter detecting circuit for detecting cycle-to-cycle jitter.

DESCRIPTION OF THE RELATED ART

A clock signal gives appropriate timings to a digital circuit. An oscillating circuit is a source of the clock signal, and is usually incorporated in the digital circuit. A phase-locked loop is popular to the skilled person as the source of clock signal. The amount of jitter relates to the stability of the phaselocked loop. It is necessary to detect the jitter generated in the phase-locked loop.

A typical example of the jitter detecting circuit is shown in FIG. 1 of the drawings. The prior art jitter detecting circuit 10a is designed to detect the phase difference between a target signal and a clock signal. The prior art jitter detecting circuit 10a comprises a delay circuit 31a and a flip-flop circuit 32a. The target signal is supplied to the delay circuit 31a, and a delay time is introduced into the propagation of the target signal by the delay circuit, and the delayed target signal and the clock signal are supplied to the two input nodes of the flip-flop circuit 32a. The flip-flop circuit 32a detects the phase difference occurring between the target signal and the clock signal, and produces an output signal representative of the jitter. Two prior art jitter detecting circuits 10a are prepared, and the target signal and the clock signal are alternately supplied thereto. Otherwise, the delay circuits 31a incorporated in plural prior art jitter detecting circuits are arranged in such a manner as to introduce delay times different from one another, and the amount of jitter is determined on the basis of the output signals of the flip-flop circuits 32a.

Another prior art jitter detecting circuit is disclosed in Japanese Patent Publication No. 7-50926. The prior art jitter detecting circuit is used for a video signal reproduced from an information storage medium. The prior art jitter detecting circuit is associated with an extracting circuit for extracting a horizontal synchronous signal from the video signal, and includes a voltage-controlled oscillating circuit, a frequency demultiplier, a variable ramp voltage generating circuit and a sample-and-hold circuit. The voltage-controlled oscillating circuit oscillates at a frequency n times larger than that of the extracting circuit, and producing an output oscillating signal. The frequency demultiplier reduces the oscillation frequency to 1/n. The variable ramp voltage generating circuit generates the ramp voltage signal varied together with the phase of the output pulse signal of the frequency demultiplier. A sampling pulse signal is produced from the horizontal synchronous signal, and is representative of the horizontal scanning period. The ramp voltage signal is sampled with the sampling pulse signal so as to obtain discrete voltage values. A control signal is produced from the discrete values, and is supplied to the control terminal of the voltage-controlled oscillating circuit and the variable ramp voltage generating circuit. The output oscillating signal serves as a jitter detecting signal.

The following problems are encountered in the prior art jitter detecting circuits. Skilled person notices the clock signal for digital circuits containing a kind of jitter shown in FIG. 2. The jitter shown in FIG. 2 is called as "cycle-to-cycle jitter". The cycle-to-cycle jitter is representative of an off-set between the timings of the continuous clock cycles or variation of relative values of the continuous clock cycles. Since digital circuits are getting faster, the clock signal is expected to be stable, and the clock cycles of the clock signal are to be constant. Not only periodic jitter (see FIG. 3) but also cycle-to-cycle jitter are required for the stable clock signal. The periodic jitter represents the dispersion of absolute values of the clock period.

The prior art jitter detecting circuit 10a shown in FIG. 1 detects the degree of phase difference at points of measurement, and an analyst decides the absolute value of the phase difference between the target signal and the clock signal at points of measurement. In other words, the analyst only decides the periodic jitter shown in FIG. 3. However, the variation of the phase difference is not left in the prior art jitter detecting circuit 10a. For this reason, it is impossible to decide the degree of the cycle-to-cycle jitter by using the prior art jitter detecting circuit 10a.

As described hereinbefore for the prior art jitter detecting circuit disclosed in the Japanese Patent Publication, the sample-and-hold circuit samples the ramp voltage produced in dependence on the phase of the output pulse signal of the frequency demultiplier with the sampling pulse signal representative of a horizontal scanning period of the horizontal synchronous signal produced in the extracting circuit, and holds the discrete values so as to produce the control signal supplied to the voltage-controlled oscillating circuit. The prior art jitter detecting circuit disclosed in the Japanese Patent Publication can not detect the cycle-to-cycle jitter.

SUMMARY OF THE INVENTION

It is therefore an important object of the present invention to provide a jitter detecting circuit, which detects the cycle-to-cycle jitter contained in a target signal.

To accomplish the object, the present invention proposes to store the phase difference in the previous clock cycle so as to compare the phase difference in the previous clock cycle with the phase difference in the current clock cycle. In accordance with one aspect of the present invention, there is provided a jitter detecting circuit for detecting a cycle-to-cycle jitter in a target clock signal comprising at least one jitter detector, and the at least one jitter detector includes a phase difference detecting unit comparing the target clock signal with a reference clock signal to see whether or not a phase difference takes place in a certain clock cycle and changing a first output signal between a first logic level representative of a presence of the phase difference and a second logic level representative of an absence of the phase difference and a state change detecting unit storing a logic level of the first output signal in a previous clock cycle, comparing the logic level of the first output signal in the certain clock cycle with the logic level of the first output signal in the previous clock cycle to see whether or not the first output signal changes the logic level between the previous clock cycle and the certain clock cycle and producing a second output signal representative of the cycle-to-cycle jitter when the phase difference detecting unit changes the first output signal between the first logic level and the second logic level.

BRIEF DESCRIPTION OF THE DRAWINGS

The features and advantages of the jitter detecting circuit will be more clearly understood from the following description taken in conjunction with the accompanying drawings in which.

DESCRIPTION OF THE PREFERRED EMBODIMENTS

First Embodiment

Figure 1:
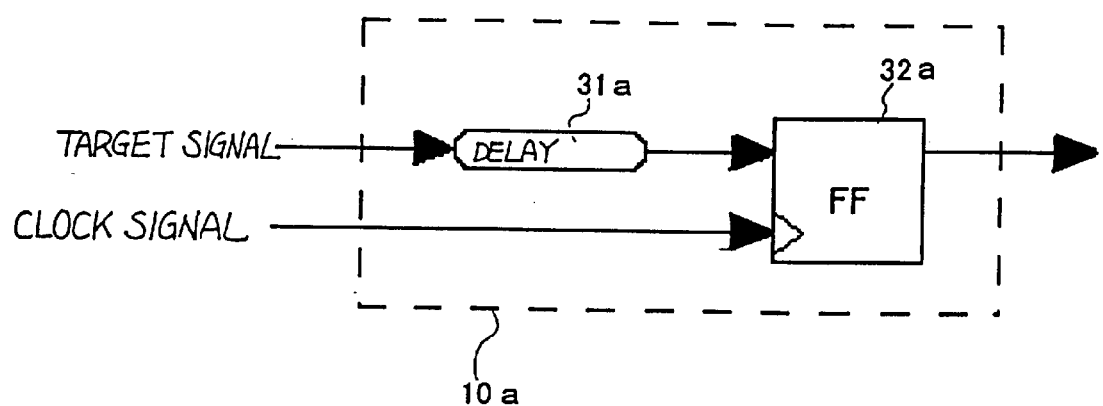
FIG. 1 is a circuit diagram showing the circuit configuration of the prior art jitter detecting circuit.
Figure 2:
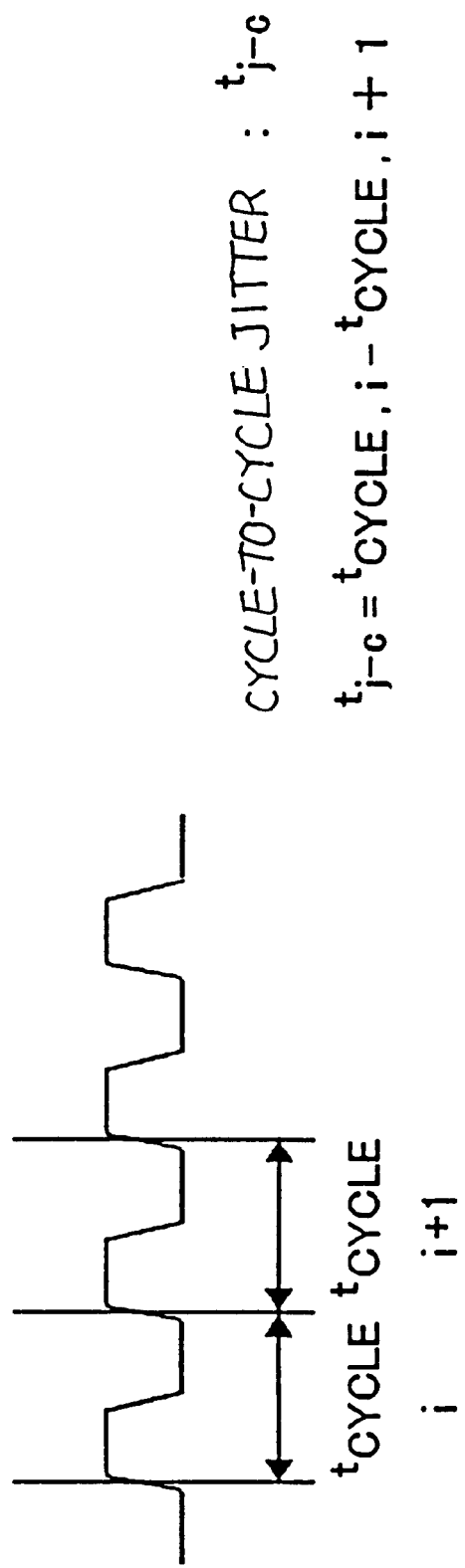
FIG. 2 is a diagram showing the cycle-to-cycle jitter in the waveform of the pulse signal.
Figure 3:
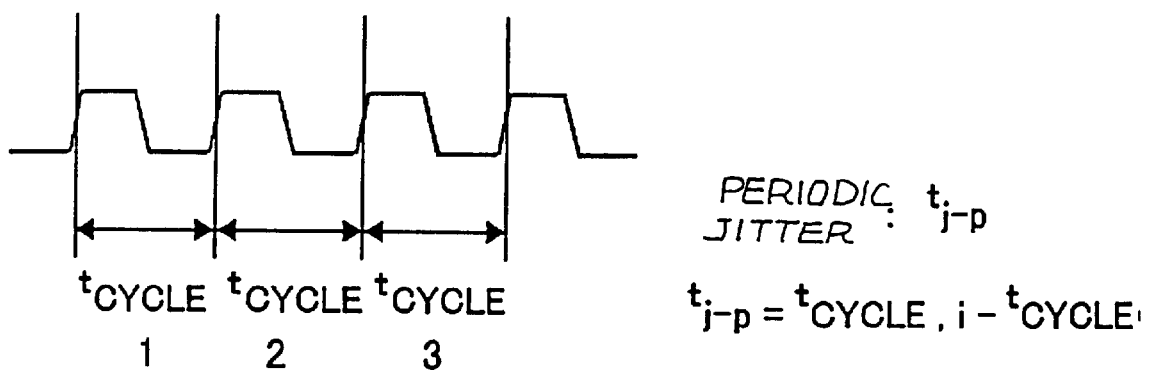
FIG. 3 is a diagram showing the periodic jitter in the waveform of the pulse signal.
Figure 4:
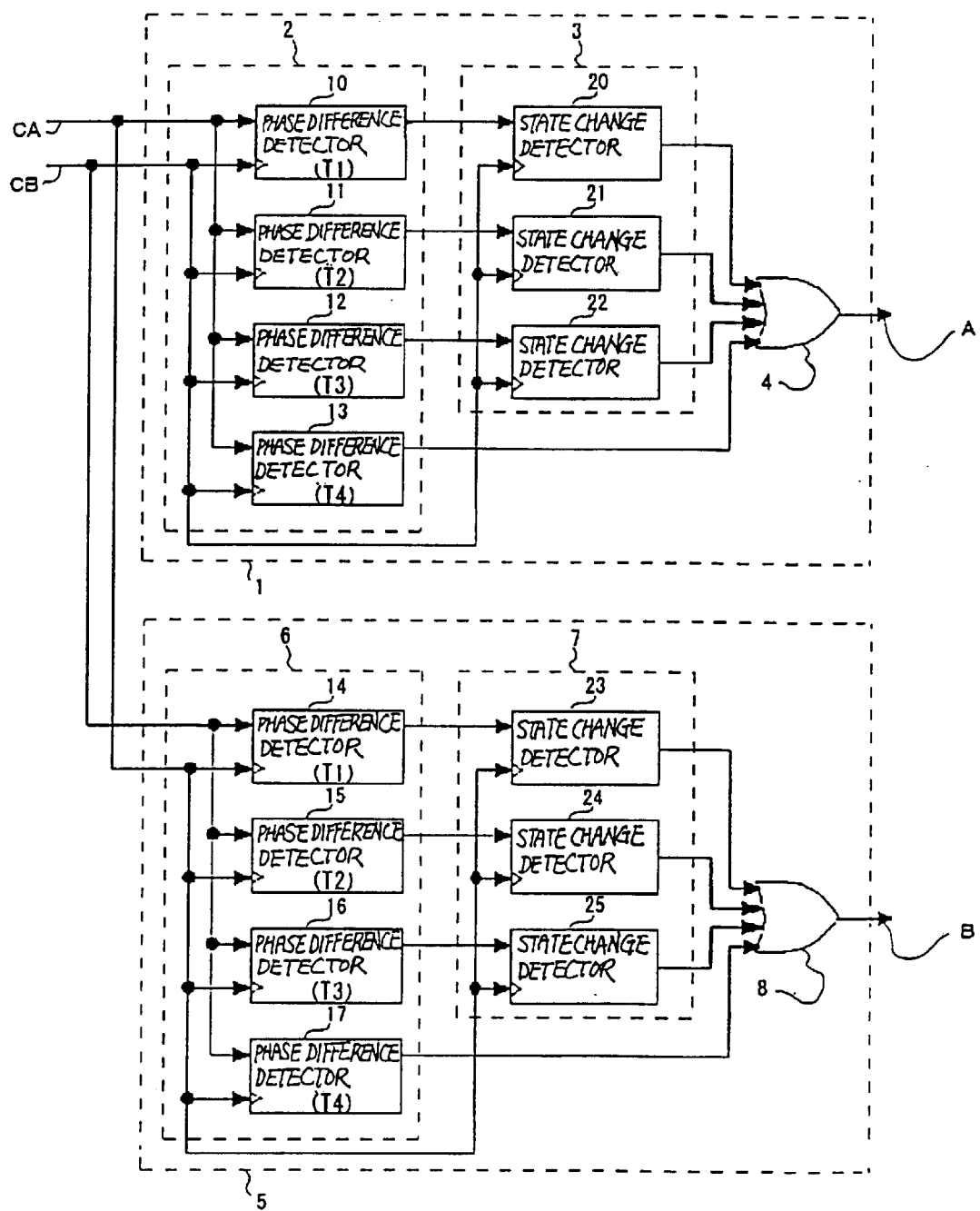
FIG. 4 is a circuit diagram showing the circuit configuration of a jitter detecting circuit according to the present invention.

Referring to FIG. 4 of the drawings, a jitter detecting circuit embodying the present invention largely comprises jitter detectors 1 and 5. The jitter detectors 1 and 5 are identical in circuit configuration with each other. A clock signal CA is supplied to a data input node of the jitter detector 1 and a clock input node of the other jitter detector 5. Another clock signal CB is supplied to a clock input node of the jitter detector 1 and a data input node of the jitter detector 5. The clock signal CA is approximately equal in frequency to the clock signal CB. Thus, the clock signals CA and CB are oppositely supplied to the jitter detectors 1 and 5. The jitter detectors 1 and 5 checks the clock signals CA and CB to see whether or not jitter is contained. When the jitter detectors 1 and 5 notice the clock signals CA and CB containing the jitter, the jitter detectors 1 and 5 changes detecting signals A and B to an active level.

The jitter detector 1 is broken down into a phase difference detector array 2, a state change detector array 3 and an OR gate 4. In the jitter detector 1, the clock signal CA is a target signal to be examined whether or not the jitter is contained, and the other clock signal CB serves as a reference clock signal. The phase difference detector array 2 includes four phase difference detectors 10, 11, 12 and 13, and each of the phase difference detectors 10, 11, 12 and 13 are supplied with the clock signal CA at the data input node and the clock signal CB at the clock input node. The phase difference detectors 10, 11, 12 and 13 check the clock signals CA and CB to see whether or not phase differences equivalent to critical delay times T1, T2, T3 and T4 take place. As will be described hereinlater in detail, delay circuits are respectively incorporated in the phase difference detectors 10, 11, 12 and 13, and introduce different delay times Td1/Td2/Td3/Td4 into signal propagation through the phase difference detectors 10, 11, 12 and 13. The critical delay time T1 is shortest, and the critical delay time T4 is longest. The critical delay time T2 is longer than the critical delay time T1, and is shorter than the critical delay time T3, i.e., T1<T2<T3<T4. When the phase difference detectors 10, 11, 12 and 13 detect the phase differences T1, T2, T3 and T4, the phase difference detectors 10, 11, 12 and 13 changes output signals to an active level, respectively. Thus, the phase difference detectors 10, 11, 12 and 13 selectively change the output signals to the active level depending upon the phase difference between the clock signals CA and CB. Although four phase difference detectors 10, 11, 12 and 13 are incorporated in the phase difference detector array 2 in this instance, the present invention does not set any limit on the number of phase difference detectors in so far as different phase differences are detectable.

The state change detector array 3 includes three state change detectors 20, 21 and 22, and the state change detectors 20, 21 and 22 are respectively associated with the phase difference detectors 10, 11 and 12. Each of the state change detectors 20, 21 and 22 has a data input node connected to the associated phase difference detector 10, 11 or 12, a clock node supplied with the clock signal CB and an output node connected to the OR gate 4. However, the phase difference detector 13 is not accompanied with any state change detector, and the output signal is directly supplied from the phase difference detector 13 to the OR gate 4.

The state change detectors 20, 21 and 22 check the data input node to see whether or not the phase difference detectors 10/11/12 detect the phase differences T1/T2/T3 within the clock cycle. When the associated phase difference detectors 10/11/12 detect the phase differences T1/T2/T3 the state change detectors 20, 21 and 22 changed the output signals to the active level. When any one of the output signals supplied from the detectors 20/21/22/13 is changed to the active level, the OR gate 4 changes the detecting signal A to the active level representative of the detection of the jitter.

As described hereinbefore, the jitter detector 5 is similar in circuit configuration to the jitter detector 1, and a phase difference detector array, a state change detector array, phase difference detectors, state change detectors and an OR gate are labeled with references 6, 7, 14/15/16/17, 23/24/25 and 8 without detailed description for avoiding repetition. The clock signal CB are supplied to the data input nodes of the phase difference detectors 14, 15, 16 and 17, and the other clock signal CA is supplied to the clock nodes of the phase difference detectors 14, 15, 16 and 17 and the clock nodes of the state change detectors 23, 24 and 25. Thus, the clock signal CB is a target signal to be examined whether or not the jitter is contained, and the other clock signal CA serves as a reference clock signal. The phase difference detectors 14, 15, 16 and 17 check the clock signals CA and CB to see whether or not the phase differences equivalent to the critical delay times T1, T2, T3 and T4 take place therebetween. When at least one of the output signals supplied from the detectors 17/23/24/25 is changed to the active level, the OR gate 8 produces the detecting signal B representative of the detection of the jitter.

Figure 5:
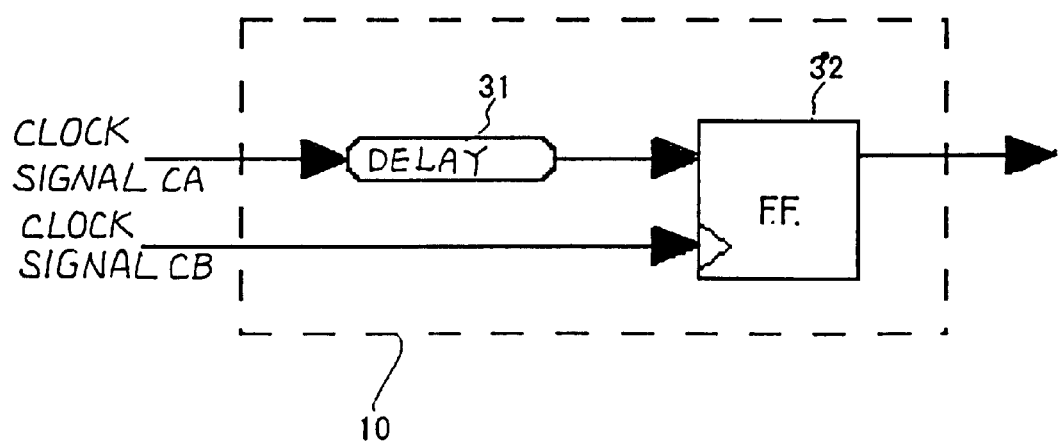
FIG. 5 is a circuit diagram showing the circuit configuration of a phase difference detector incorporated in the jitter detecting circuit.

The phase difference detectors 10/11/12/13/14/15/16/17 are similar in circuit configuration to one another except the delay time to be introduced. For this reason, only the phase difference detector 10 is described hereinbelow in detail. As shown in FIG. 5, the phase difference detector 10 includes a delay circuit 31 and a flip-flop circuit 32. The flip-flop circuit 32 is abbreviated as "F.F." in FIG. 5. As described hereinbefore, the jitter detector 1 checks the clock signal CA to see whether or not the jitter rides thereon. Accordingly, the clock signal CA is supplied through the delay circuit 31 to a data input node of the flip-flop circuit 32, and the clock signal CB is directly supplied to the clock node of the flip-flop circuit 32. The delay circuit 31 introduces the delay time Td1 into the propagation of the clock signal CA, and reaches the data input node of the flip-flop circuit 32 after time Td1 from the change of the clock signal CA. For this reason, the phase difference detector 10 has the set-up time T1 equal to the sum between the delay time Td1 and the set-up time of the flip-flop circuit 32.

When the target signal CA rises, the delay circuit 31 introduces the delay time Td1 into the propagation of the target signal CA. Upon expiry of the delay time Td1, the delay circuit 31 supplies the delayed target signal CA to the flip-flop circuit 32. When the reference clock signal CB rises, the flip-flop circuit 32 is responsive to the delayed target signal, and makes the output signal consistent with the delayed target signal. For this reason, when the time difference between the pulse rise of the target signal CA and the pulse rise of the reference clock signal CB is longer than the critical delay time or the set-up time T1, the phase difference detector 10 changes the output signal.

Similarly, the phase difference detectors 11, 12 and 13 have the set-up time T2 equal to the sum between the delay time Td2 and the set-up time of the flip-flop circuit 32, the set-up time T3 equal to the sum between the delay time Td3 and the set-up time of the flip-flop circuit 32 and the set-up time T4 equal to the sum between the delay time Td4 and the set-up time of the flip-flop circuit 32, respectively. On the other hand, the jitter detector 5 checks the clock signal CB to see whether or not the jitter rides thereon, and the clock signal CA serves as the reference clock signal. The phase difference detectors 14, 15, 16 and 17 have the set-up time T1 equal to the sum between the delay time Td1 and the set-up time of the flip-flop circuit 32, the set-up time T2 equal to the sum between the delay time Td2 and the setup time of the flip-flop circuit 32, the set-up time T3 equal to the sum between the delay time Td3 and the set-up time of the flip-flop circuit 32 and the set-up time T4 equal to the sum between the delay time Td4 and the setup time of the flip-flop circuit 32. The set-up time T1/T2/T3/T4 serve as the critical delay time.

The phase difference detectors 11, 12, 13, 14, 15, 16 and 17 behave as similar to the phase difference detector 10. When the time difference between the pulse rise of the target signal CA and the pulse rise of the reference clock signal CB is equal to or longer than the critical delay time T2/T3/T4, the phase difference detector 11/12/13 changes the output signal to the active level. On the other hand, when the time difference between the pulse rise of the target signal CB and the pulse rise of the reference clock signal CA is equal to or longer than the critical delay time T1/T2/T3/T4, the phase difference detector 14/15/16/17 changes the output signal to the active level.

Figure 6:
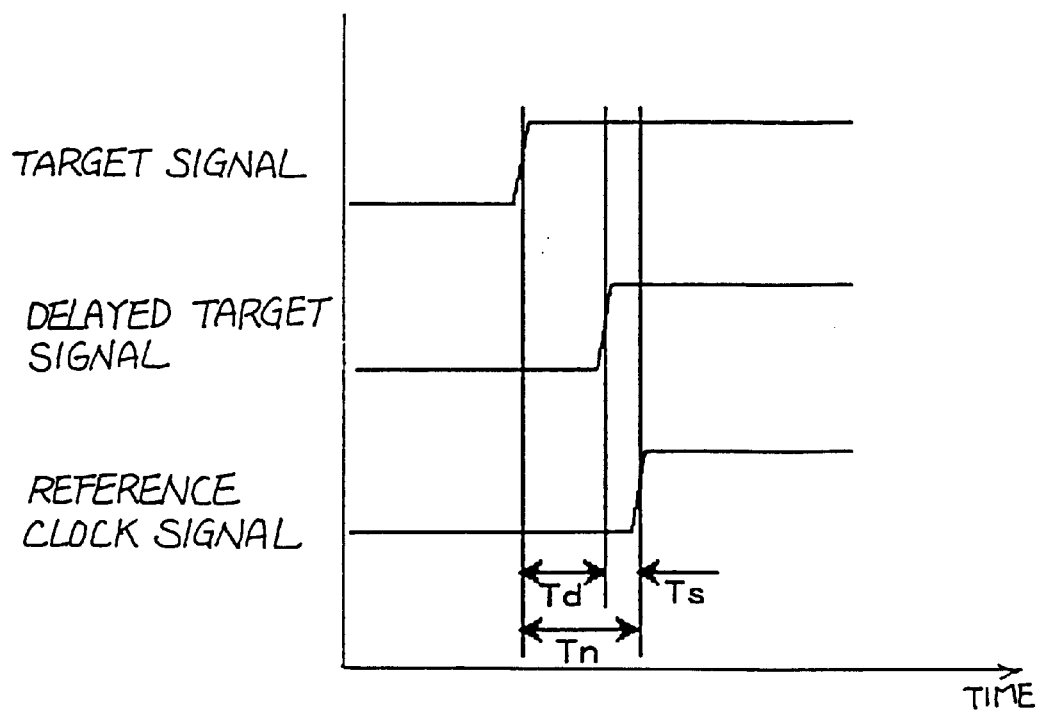
FIG. 6 is a timing chart showing the circuit behavior of the phase difference detector.

FIG. 6 illustrates the circuit behavior of the phase difference detectors 10/11/12/13/14/15/16/17. Td, Ts and Tn are indicative of the delay time Td1/Td2/Td3/Td4, the set-up time of the flip-flop circuit 32 and the set-up time or the critical delay time T1/T2/T3/T4 of the phase difference detector 10/11/12/13/14/15/16/17, respectively. The critical delay time Tn, i.e., T1/T2/T3/T4 is equal to the sum of the delay time Td and the set-up time Ts, i. e., Tn=Td+Ts. Thus, the critical delay time Tn is varied together with the delay time Td. As will be understood, the phase difference detectors 10/11/12/13/14/15/16/17 includes the delay circuits adjusted to the delay time Td different from one another, and, accordingly, compare the phase difference between the clock signals CA and CB with the critical delay times Tn different from one another to see whether or not the phase difference is equal to or longer than the critical delay times Tn.

Figure 7:
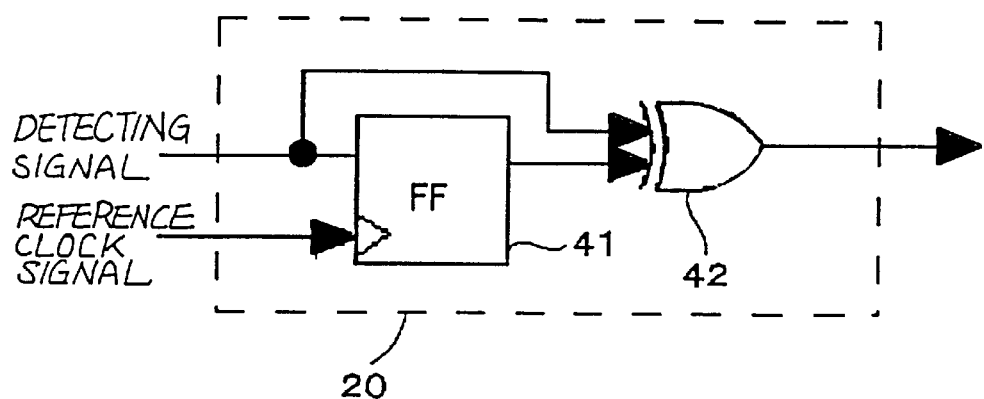
FIG. 7 is a circuit diagram showing the circuit configuration of a state change detector incorporated in the jitter detecting circuit.

FIG. 7 shows the circuit configuration of the state change detector 20. Although six state change detectors 20, 21, 22, 23, 24 and 25 are incorporated in the jitter detectors 1 and 5, all the state change detectors 20/21/22/23/24/25 are similar in circuit configuration to one another. For this reason, description is made on the state change detector 20, only. The state change detector 20 includes a flip-flop circuit 41 and an exclusive-OR gate 42. The output signal is supplied from the associated phase difference detector 10 to the data input node of the flip-flop circuit 41 and a signal input node of the exclusive-OR gate 42, and the reference clock signal CB is supplied to the clock input node of the flip-flop circuit 41. The output node of the flip-flop circuit 41 is connected to the other signal input node of the exclusive-OR gate 42. The flip-flop circuit 41 is responsive to the pulse rise of the reference clock signal CB so as to make the output signal consistent in signal level with the output signal. The flip-flop circuit 41 keeps the signal level at the output node thereof until the next pulse rise of the reference clock signal CB. For this reason, the exclusive-OR gate 42 compares the output signal produced in the previous clock cycle with the output signal presently supplied from the associated phase difference detector 10 to see whether or not the associated phase difference detector 10 changes the signal level of the output signal. When the associated phase difference detector 10 keeps the signal level identical with the previous signal level, the logic level at the signal input node is identical with the logic level at the other signal input node, and the exclusive-OR gate 42 keeps the detecting signal A in logic "0" level. On the other hand, if the associated phase difference detector 10 changes the output signal from the previous clock cycle to the current clock cycle, the signal input nodes are different in logic level from one another, and the exclusive-OR gate 42 changes the detecting signal A to logic "1" level.

Subsequently, description is made on the detection of the jitter. The clock signal CA is supplied to the data input node of the jitter detector 1, and the other clock signal CB is supplied to the clock input node of the jitter detector 1. The clock signals CA and CB are supplied to the clock input node and the data input node of the other jitter detector 5. Thus, the two clock signals CA and CB serve as the target signal and the reference clock signal differently between the jitter detectors 1 and 5. When the phase difference takes place, the phase difference is seemed to be due to the jitter. Furthermore, the state change detector arrays 3 and 7 compare the phase difference in the current clock cycle with the phase difference in the previous clock cycle, and decide the amount of cycle-to-cycle jitter. When the clock signal CA is in advance of or delayed from the other clock signal CB, the phase difference takes place. However, the jitter detecting circuit can detect the phase difference, because the clock signals CA and CB are oppositely supplied to the jitter detectors 1 and 5.

Figure 8:
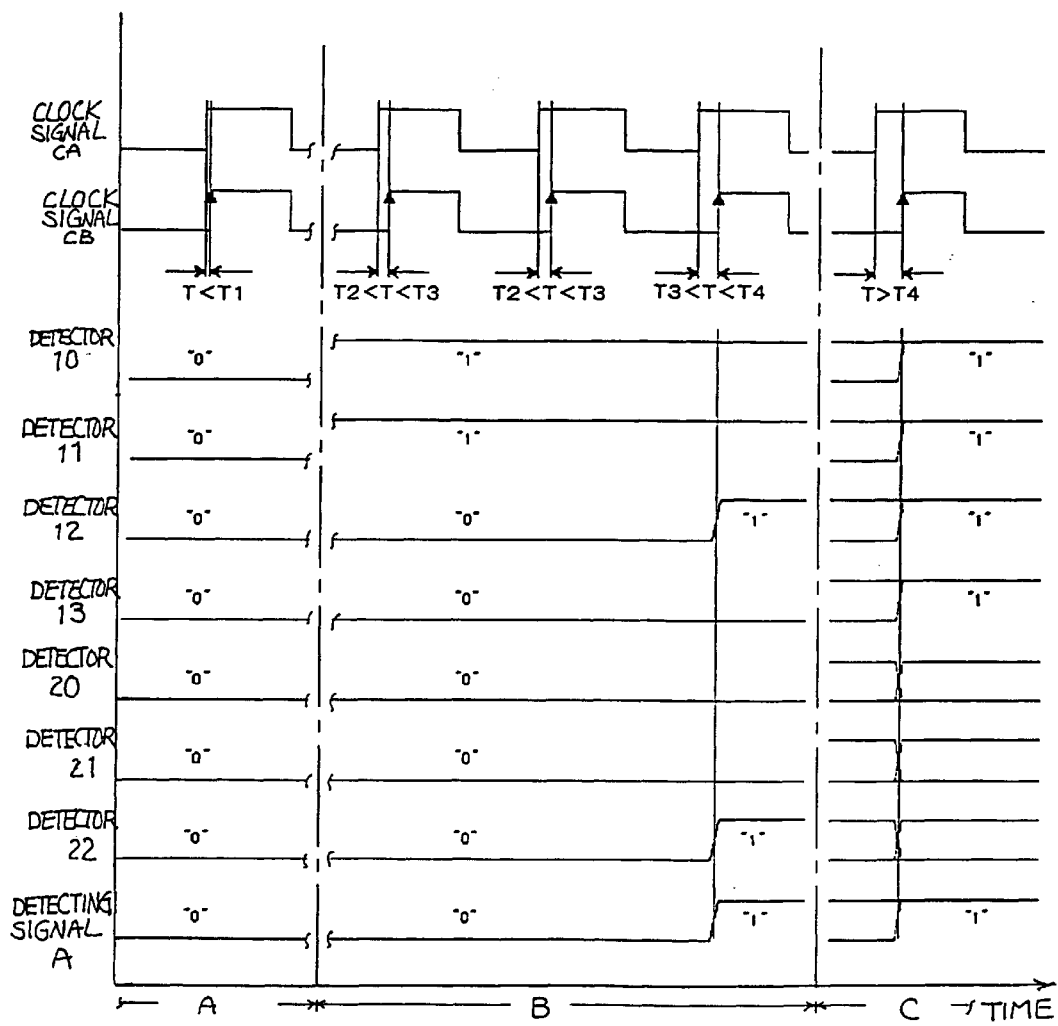
FIG. 8 is a timing chart showing the behavior of the jitter detecting circuit.

FIG. 8 illustrates the circuit behavior of the jitter detecting circuit. The clock signal CA is the target signal, and the clock signal CB serves as the reference clock signal. The clock signal CA gradually advances with respect to the clock signal CB through stages A, B and C. The phase difference T is shorter than the shortest critical delay time T1 in stage A. The phase difference T exceeds the critical delay times T2 and T3 in stage B, but does not exceed the critical delay time T4. The phase difference T exceeds the critical delay time T4 in stage C.

In stage A, the first pair of clock pulses is supplied to the jitter detector 1. The phase difference T is less than the critical delay time T1, and all of the phase difference detectors 10, 11, 12 and 13 keeps the output signals in logic "0" level. Accordingly, all of the state change detectors 20, 21 and 22 keeps the output signals in logic "0" level. As a result, the OR gate 4 outputs the detecting signal A of logic "0" level representative of the absence of the jitter.

Though not shown in FIG. 8, there are several pairs of clock pulses before the second pair of clock pulse in stage B, and the phase difference T exceeds the critical delay time T2. When the phase difference exceeded the critical delay time T1, the phase difference detector 10 changed the output signal to logic "1" level, and, accordingly, the stage change detector 20 changed the output signal to logic "1" level. Similarly, when the phase difference T exceeded the critical delay time T2, the phase difference detector 11 changed the output signal to logic "1" level, and the associated stage change detector 21 changed the output signal to logic "1" level. The phase difference detectors 10 and 11 has kept the output signals in logic "1" level. However, the stage change detectors 20 and 21 recovered the output signals to logic "0" level at the next clock pulse CB. For this reason, the output signals of the phase difference detectors 10 and 11 and the output signals of the state change detectors 20 and 21 are in logic "1" level and logic "0" level at the second pair of clock pulses in stage B, respectively.

The phase difference T exceeds the critical delay time T3 at the fourth pair of clock pulses. Then, the phase difference detector 12 changes the output signal to logic "1" level, and, accordingly, the stage change detector 22 changes the output signal to logic "1" level. With the output signal of logic "1" level, the OR gate 4 changes the detecting signal A to logic "1" level.

There are a lot of pairs of clock pulses after entry into stage C. However, they are not shown in FIG. 8. The phase difference T exceeds the critical delay time T4 at the fifth pair of clock pulses. Then, the phase difference detectors 10, 11, 12 and 13 change the output signals to logic "1" level, and, accordingly, the stage change detectors 20, 21 and 22 change the output signals to logic "1" level. As a result, the OR gate 4 changes the detecting signal A to logic "1" level.

The circuit behavior of the jitter detector 1 is summarized as follows. The jitter detector 1 keeps the detecting signal A in logic "0" level in so far as the phase difference T is less than the critical delay time T1. When the phase difference T exceeds the critical delay time T1, T2 or T3, the jitter detector 1 momentarily changes the detecting signal A to logic "1" level at the pulse rise of the reference clock signal CB. However, the detecting signal A is recovered to logic "0" level at the next pulse rise of the reference clock signal CB. The jitter detector 1 keeps the detecting signal A in logic "1" after the phase difference T exceeds the critical delay time T4.

In case where the clock signal CB advances, the other jitter detector 5 behaves as described hereinbefore.

As will be understood from the foregoing description, the jitter detecting circuit according to the present invention compares the output signals of the phase difference detectors in a clock cycle with the output signals of the phase difference detectors in the next clock cycle. Thus, the jitter detecting circuit can detect the cycle-to-cycle jitter rising on the target signal.

Moreover, the jitter detecting circuit according to the present invention keeps the detecting signal A or B in logic "0" level in so far as the phase difference T is less than the shortest critical delay time T1, and keeps the detecting signal A or B in logic "1" level after the phase difference T exceeds the longest critical delay time T4. This means that the jitter detecting circuit ignores a small amount of jitter usually rising on the clock signal, but gives a warning to user when the jitter is serious. While the amount of jitter is varied therebetween, the jitter detecting circuit momentarily gives the warning to user. Thus, the jitter detecting circuit changes the warning depending upon the amount of jitter.

Second Embodiment

Figure 9:
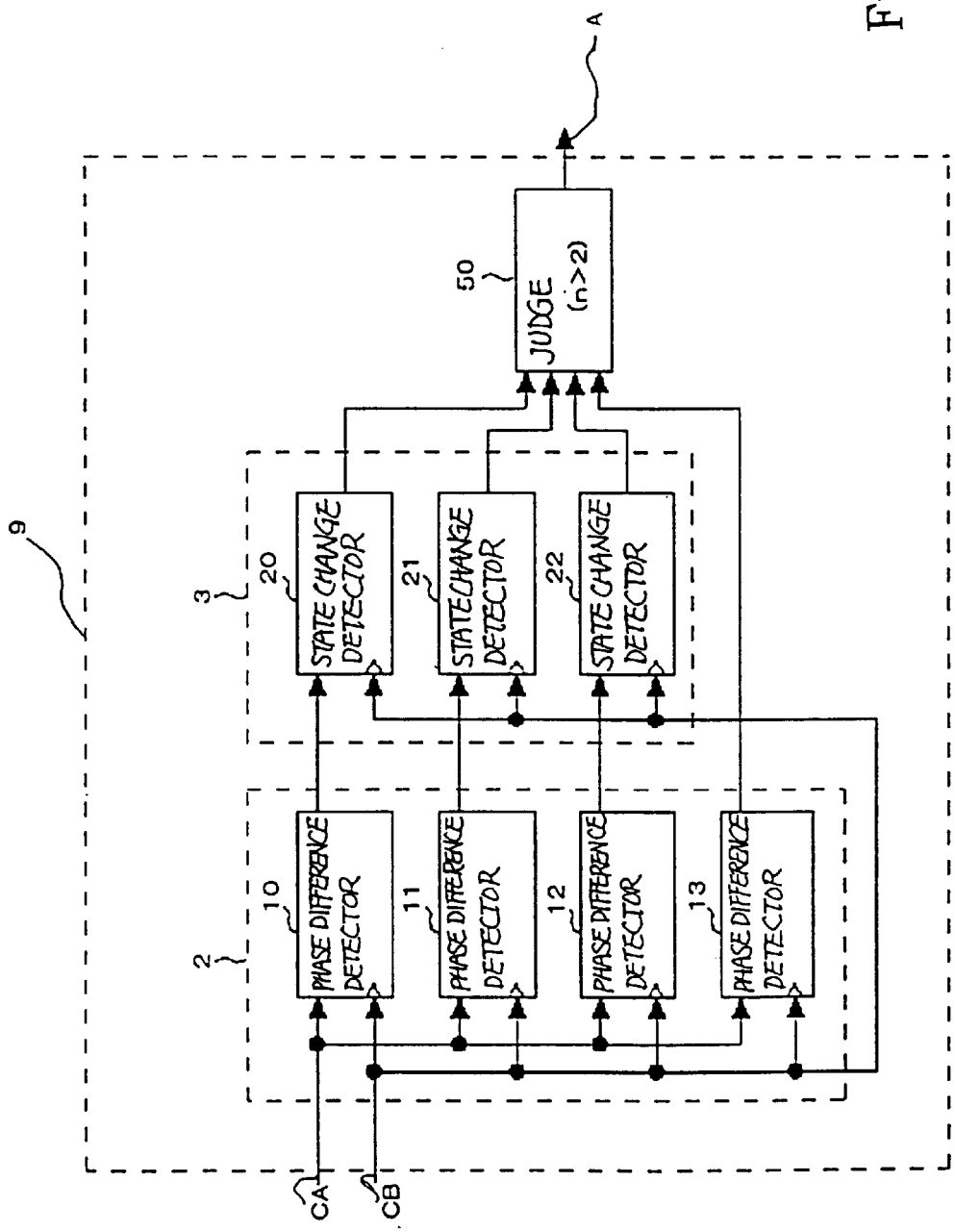
FIG. 9 is a circuit diagram showing the circuit configuration of a jitter detector incorporated in another jitter detecting circuit according to the present invention.
Figure 10:
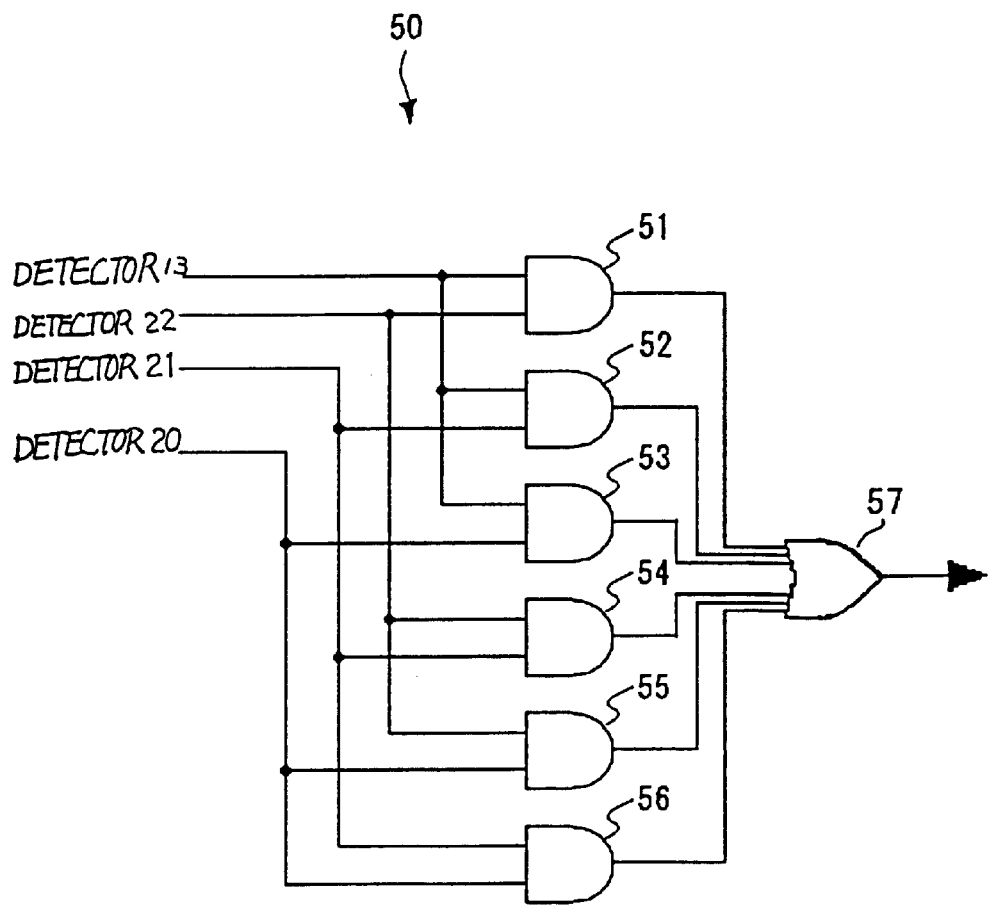
FIG. 10 is a circuit diagram showing the circuit configuration of a judging circuit incorporated in the jitter detector.

Turning to FIG. 9 of the drawings, a jitter detector 9 is incorporated in another jitter detecting circuit embodying the present invention. The jitter detecting circuit implementing the second embodiment has two jitter detectors 9, and the target signal and the reference clock signal are changed between the two jitter detectors 9 as similar to those of the first embodiment.

The jitter detector 9 includes the phase difference detector array 2, the state change detector array 3 and a judging circuit 50. The phase difference detectors 10, 11, 12 and 13 form in combination the phase difference detector array 2, and the state change detectors 20, 21 and 22 are incorporated in the state change detector array 3. The phase difference detectors 10, 11, 12 and 13 and the stage change detectors 20, 21 and 22 are similar to those of the first embodiment, and no further description is incorporated hereinbelow for the sake of simplicity.

The judging circuit 50 prevents the jitter detector 9 from being too sensitive to the previous phase difference close to the critical delay time Tn of the $n^{th}$ phase difference detector. As described hereinbefore, when any one of the state change detectors 20/21/22 or 23/24/25 changes the output signal to logic "1" level, the OR gate 4/8 immediately changes the detecting signal A/B to logic "1" level. On the other hand, the judging circuit 50 changes the detecting signal A to logic "1" level when more than one state change detector changes the output signal to logic "1" level.

The judging circuit 50 includes two-input AND gates 51, 52, 53, 54, 55 and 56 and an OR gate 57. The output signals are selectively supplied from the phase difference detector 13 and the state change detectors 20/21/22 to the NAD gates 51, 52, 53, 54, 55 and 56, and the AND gates 51, 52, 53, 54, 55 and 56 supply output signals from the output nodes thereof to the input nodes of the OR gate 57 in parallel. The AND gates 51, 52, 53, 54, 55 and 56 are respectively assigned all the combinations of the output signals. For this reason, when two output signals are changed to logic "1" level, the associated AND gate 51/52/53/54/55/56 changes the output signal to logic "1" level, and, accordingly, the OR gate 57 changes the detecting signal A to logic "1" level. Although six two-input AND gates are incorporated in the jitter detector 50, the number of two-input AND gates is varied together with the number of state change detectors.

The jitter detecting circuit implementing the second embodiment achieves all the advantages of the first embodiment. Moreover, the jitter detector 9 is not so sensitive to the output signals that the jitter detecting circuit implementing the second embodiment does not mistakenly change the detecting signal A/B.

Third Embodiment

Figure 11:
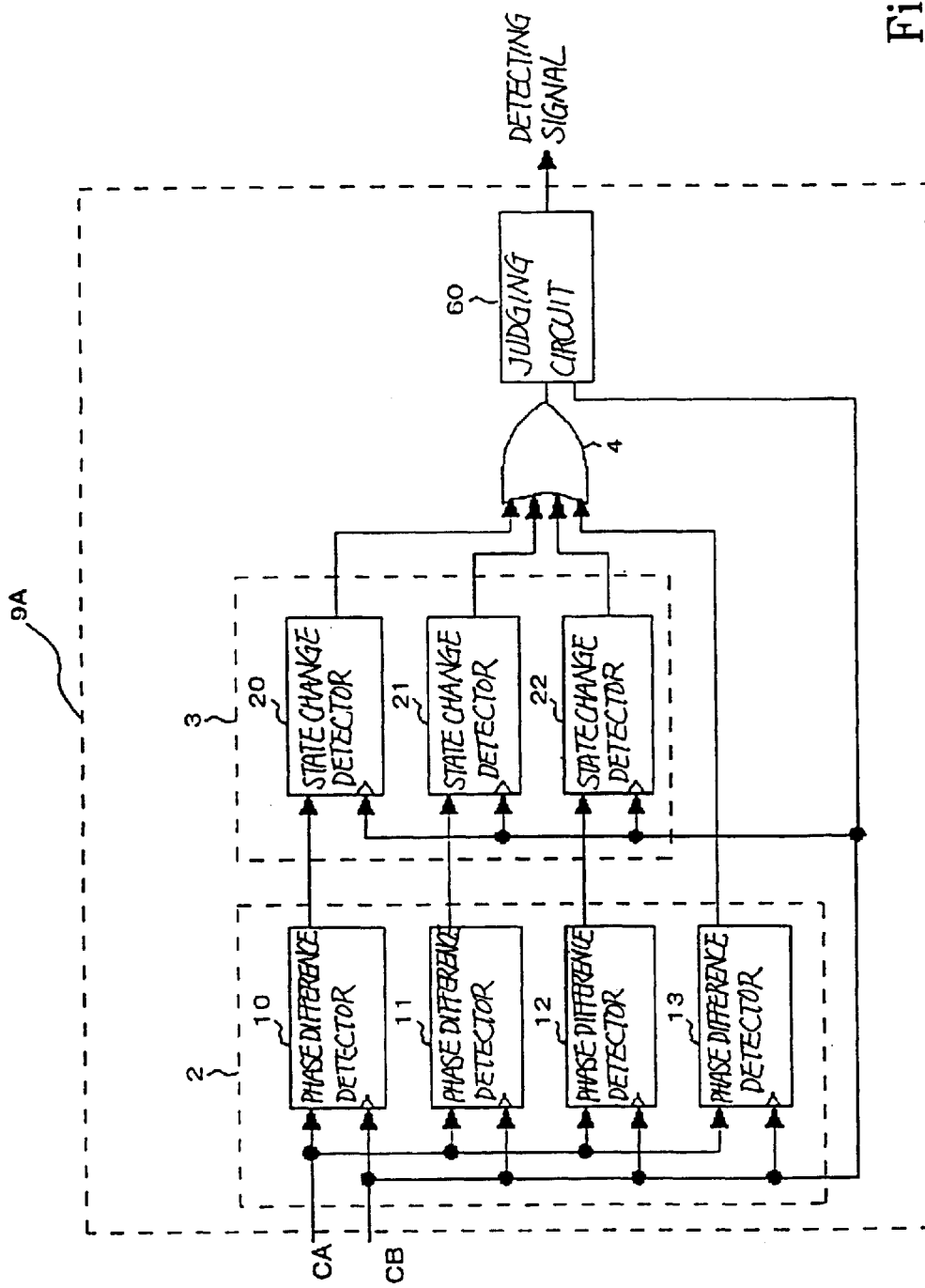
FIG. 11 is a circuit diagram showing the circuit configuration of a jitter detector incorporated in yet another jitter detecting circuit.
Figure 12:
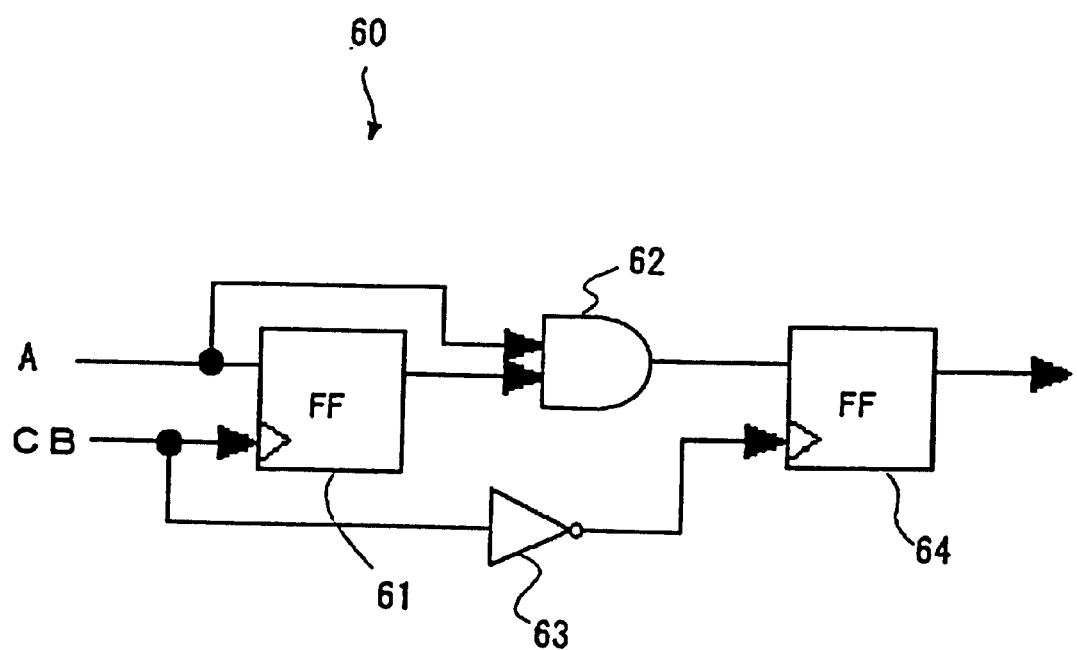
FIG. 12 is a circuit diagram showing the circuit configuration of judging circuit incorporated in the jitter detector.

Turning to FIG. 11 of the drawings, a jitter detector 9A forms a part of yet another jitter detecting circuit embodying the present invention. The jitter detecting circuit implementing the third embodiment has two jitter detectors 9A, and the target signal and the reference clock signal are changed between the two jitter detectors 9A as similar to those of the first embodiment.

The jitter detector 9A includes the phase difference detector array 2, the state change detector array 3, an OR gate 4 and a judging circuit 60. The phase difference detectors 10, 11, 12 and 13 form in combination the phase difference detector array 2, and the state change detectors 20, 21 and 22 are incorporated in the state change detector array 3. The phase difference detectors 10, 11, 12 and 13 and the stage change detectors 20, 21 and 22 are similar to those of the first embodiment, and no further description is incorporated hereinbelow for the sake of simplicity.

The judging circuit 60 decides the target signal CA out of phase when the phase difference detectors detect the phase difference over two clock cycles. FIG. 9 illustrates the circuit configuration of the judging circuit 60. The judging circuit 60 includes a flip-flop circuit 61, an AND gate 62, an inverter 63 and a flip-flop circuit 64. The detecting signal A is supplied to the data input node of the flip-flop circuit 61 and one of the input nodes of the AND gate 62. The clock signal CB is directly supplied to the clock input node of the flip-flop circuit 61, and is further supplied to the clock input node of the flip-flop circuit 64 through the inverter 63. The output signal is supplied form the data output node of the flip-flop circuit 61 to the other input node of the AND gate 62, and the AND gate 62 supplies the output signal from the data output node thereof to the data input node of the flip-flop circuit 64. The detecting signal is output from the data output node of the flip-flop circuit 64.

Figure 13:
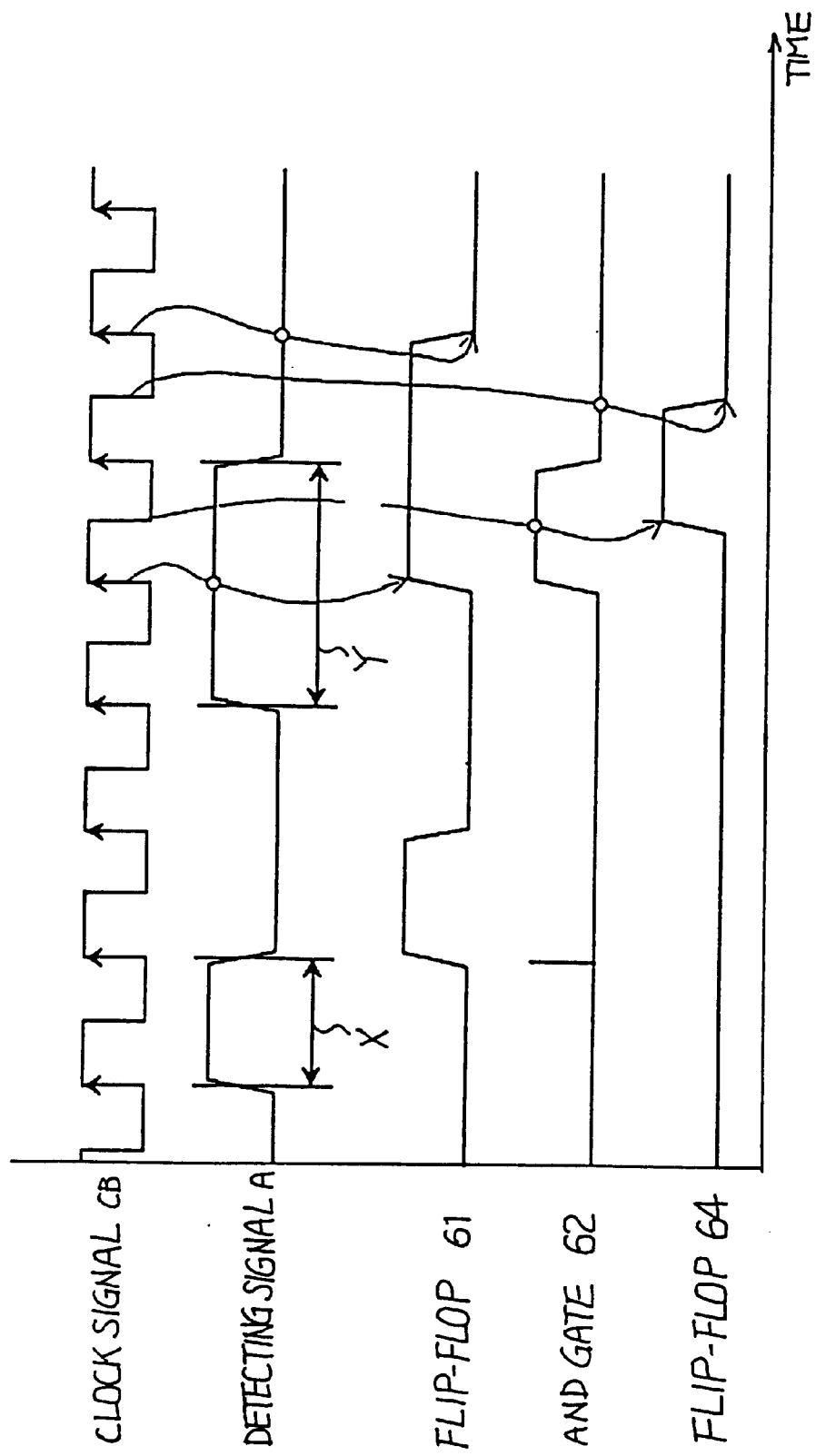
FIG. 13 is a timing chart showing the circuit behavior of the judging circuit.

The clock signal CB periodically rises as shown in FIG. 13. The OR gate 4 changes the detecting signal A to logic "1" level in time period X equivalent to a single clock cycle, i.e., the first clock cycle. The OR gate 4 changes the detecting signal A to logic "1" level in time period equivalent to two clock cycles, i.e., the fourth and fifth clock cycles.

The detecting signal A is latched by the flip-flop circuit 61at the pulse rise of the second clock cycle, and the flip-flop circuit 61 keeps the output signal in logic "1" level in the second clock cycle. However, the flip-flop circuit 61 recovers the output signal to logic "0" level at the pulse rise of the third clock cycle. Although the AND gate 62 momentarily changes the output signal to logic "1" level due to noise such as hazard, the logic "1" level is never latched by the flip flop circuit 64. For this reason, even though the detecting signal A is changed to logic "1" level in the first clock cycle, the flip-flop circuit 64 keeps the detecting signal in logic "0" level.

When the detecting signal A stays in logic "1" level over two clock cycles, i.e., the fourth and fifth clock cycles, the flip-flop circuit 61 also keeps the output signal in logic "1" level over two clock cycles, i.e., the fifth and sixth clock cycles. The AND gate keeps the output signal in logic "1" level in the fifth clock cycle, and the flip-flop circuit 64 latches the logic "1" level at the pulse decay of the fifth clock cycle. Thus, if the phase difference is continued over two clock cycles or more, the judging circuit 60 changes the detecting signal to logic "1" level.

The jitter detecting circuit implementing the third embodiment achieves all the advantages of the first embodiment. Moreover, the jitter detector 9A does not mistakenly changes the detecting signal to logic "1" level, because the jitter detector 9A changes the detecting signal when the OR gate 4 keeps the detecting signal A in logic "1" level over two clock cycles or more. The flip-flop 64 is responsive to the pulse decay so as to latch the output signal of the AND gate 62. This feature is desirable, because the flip-flop circuit 64 is free from the noise riding on the output signal of the AND gate 62.

As will be appreciated from the foregoing description, the cycle-to-cycle jitter is detectable by the jitter detecting circuit according to the present invention.

In the above-described embodiments, the phase difference detector array 2/6 and the state change detector array 3/7 serve as a phase difference detecting unit and a state change detecting unit, respectively. The OR gate 4/8, the judging circuit 50 and the combination of the OR gate 4 or the judging circuit 60 are corresponding to a detecting signal generating circuit.

Although particular embodiments of the present invention have been shown and described, it will be apparent to those skilled in the art that various changes and modifications may be made without departing from the spirit and scope of the present invention.

For example, the inverted signals of the clock signals CA and CB may be supplied to the jitter detecting circuit. In this instance, the phase of the clock signal CA is compared with the phase of the clock signal CB at the pulse decay.

The phase difference detector array 2 and the state the change detector array 3 may have more than four phase difference detectors and more than three state change detectors.

The number of output signals described in conjunction with the second embodiment and the number of clock cycles described in conjunction with the third embodiment are arbitrarily changed depending up on the sensitivity to be required.

If it is necessary to detect the target signal in advance of or delayed from the reference clock signal, only one jitter detector is incorporated in the jitter detecting circuit according to the present invention.

The output signals are directly supplied from the state change detectors to the outside thereof. Namely, the logic circuit 4/8 may be deleted from the jitter detecting circuit. In this instance, another state change detector may be connected to the phase difference detector 13/17.

What is claimed is:

1. A jitter detecting circuit for detecting a cycle-to-cycle jitter in a target clock signal comprising at least one jitter detector, said at least one jitter detector including
a phase difference detecting unit comparing said target clock signal with a reference clock signal to see whether or not a phase difference takes place in a certain clock cycle and changing a first output signal between a first logic level representative of a presence of said phase difference and a second logic level representative of an absence of said phase difference, and
a state change detecting unit storing a logic level of said first output signal in a previous clock cycle, comparing the logic level of said first output signal in said certain clock cycle with the logic level of said first output signal in said previous clock cycle to see whether or not said first output signal changes said logic level between said previous clock cycle and said certain clock cycle and producing a second output signal representative of said cycle-to-cycle jitter when said phase difference detecting unit changes said first output signal between said first logic level and said second logic level.

2. The jitter detecting circuit as set forth in claim 1, in which said phase difference detecting unit includes plural phase difference detectors for producing first output subsignals forming parts of said first output signal and representative of phase differences different in amount from one another, and said state change detecting unit includes plural state change detectors selectively connected to said plural phase difference detectors for producing second output sub-signals forming parts of said second output signal on the basis of said first output sub-signals, respectively.

3. The jitter detecting circuit as set forth in claim 2, in which said plural phase difference detectors include delay circuits respectively forming parts of said plural phase difference detectors and introducing delay times different from one another into propagation of said target signal for producing delayed target signals, respectively, and bi-stable circuits respectively forming other parts of said plural phase difference detectors, each of said bi-stable circuits having a signal input node supplied with one of said delayed target signals, a clock input node supplied with said reference clock signal and a signal output node for outputting one of said first output sub-signals.

4. The jitter detecting circuit as set forth in claim 3, in which each of said bi-stable circuits is a flip-flop circuit.

5. The jitter detecting circuit as set forth in claim 4, in which each of said phase differences is equivalent to the sum of the delay time introduced by associated one of said delay circuits and a set-up time of said flip-flop circuit.

6. The jitter detecting circuit as set forth in claim 2, in which each of said plural state change detectors includes a data storing circuit having a data input node supplied with the first output sub-signal from the associated one of said plural phase difference detectors and a control node supplied with said reference clock signal for storing said first output sub-signal and a signal output node, and an exclusive- OR gate having a first input node supplied with said first output sub-signal and a second input node connected to said signal output node of said bi-stable circuit.

7. The jitter detecting circuit as set forth in claim 6, in which said data storing circuit is a flip-flop circuit.

8. The jitter detecting circuit as set forth in claim 2, in which said at least one jitter detector further comprises a detecting signal generating circuit having plural input nodes respectively connected to said plural state change detectors for receiving said second output sub-signals and one of said plural phase difference detectors detecting the most serious phase difference for receiving associated one of said first output sub-signals for producing a jitter detecting signal representative of existence of said cycle-to-cycle jitter.

9. The jitter detecting circuit as set forth in claim 8, in which said detecting signal generating circuit has an OR gate having plural input nodes connected to said plural state change detectors and said one of said plural phase difference detectors detecting the most serious phase difference.

10. The jitter detecting circuit as set forth in claim 9, in which said plural phase difference detectors include delay circuits respectively forming parts of said plural phase difference detectors and introducing delay times different from one another into propagation of said target signal for producing delayed target signals, respectively, and bi-stable circuits respectively forming other parts of said plural phase difference detectors, each of said bi-stable circuits having a signal input node supplied with one of said delayed target signals, a clock input node supplied with said reference clock signal and a signal output node for outputting one of said first output sub-signals.

11. The jitter detecting circuit as set forth in claim 10, in which each of said bi-stable circuits is a flip-flop circuit.

12. The jitter detecting circuit as set forth in claim 10, in which each of said phase differences is equivalent to the sum of the delay time introduced by associated one of said delay circuits and a set-up time of said flip-flop circuit.

13. The jitter detecting circuit as set forth in claim 10, in which each of said plural state change detectors includes a data storing circuit having a data input node supplied with the first output sub-signal from the associated one of said plural phase difference detectors and a control node supplied with said reference clock signal for storing said first output sub-signal and a signal output node, and an exclusive-OR gate having a first input node supplied with said first output sub-signal and a second input node connected to said signal output node of said bi-stable circuit.

14. The jitter detecting circuit as set forth in claim 13, in which said data storing circuit is a flip-flop circuit.

15. The jitter detecting circuit as set forth in claim 8, in which said detecting signal generating circuit checks said one of said first output sub-signals and said second output sub-signals to see whether or not at least two of said plural phase difference detectors concurrently detect the phase differences, and produces said jitter detecting signal representative of the presence of said cycle-to-cycle jitter when said at least two of said plural phase difference detectors concurrently detect said phase differences.

16. The jitter detecting circuit as set forth in claim 15, in which said plural phase difference detectors include delay circuits respectively forming parts of said plural phase difference detectors, selectively connected to said plural state change detectors and introducing delay times different from one another into propagation of said target signal for producing delayed target signals, respectively, and bi-stable circuits respectively forming other parts of said plural phase difference detectors, each of said bi-stable circuits having a signal input node supplied with one of said delayed target signals, a clock input node supplied with said reference clock signal and a signal output node for outputting one of said first output sub-signals.

17. The jitter detecting circuit as set forth in claim 16, in which each of said bi-stable circuits is a flip-flop circuit.

18. The jitter detecting circuit as set forth in claim 17, in which each of said phase differences is equivalent to the sum of the delay time introduced by associated one of said delay circuits and a set-up time of said flip-flop circuit.

19. The jitter detecting circuit as set forth in claim 16, in which each of said plural state change detectors includes a data storing circuit having a data input node supplied with the first output sub-signal from the associated one of said plural phase difference detectors and a control node supplied with said reference clock signal for storing said first output sub-signal and a signal output node, and an exclusive-OR gate having a first input node supplied with said first output sub-signal and a second input node connected to said signal output node of said bi-stable circuit.

20. The jitter detecting circuit as set forth in claim 19, in which said data storing circuit is a flip-flop circuit.

21. The jitter detecting circuit as set forth in claim 15, in which said detecting signal generator includes plural logic gates connected to plural combinations of said plural state change detectors and one of said plural phase difference detectors detecting the most serious phase difference, respectively, each of said plural logic gates producing a third output signal when the associated one of said plural combinations detects the phase differences, and another logic gate connected to said plural logic gate and producing said jitter detecting signal when at least one of said plural logic gates produces said third output signal.

22. The jitter detecting circuit as set forth in claim 21, in which each of said plural logic gates is an AND gate.

23. The jitter detecting circuit as set forth in claim 21, in which said another logic gate is an OR gate.

24. The jitter detecting circuit as set forth in claim 8, in which said detecting signal generating circuit includes a logic circuit having signal input nodes respectively connected to said plural state change detectors and one of said plural phase difference detectors detecting the most serious phase difference and producing a third output signal when at least one of said second output sub-signals and the first output sub-signal is changed to an active level, and a judging circuit connected to said logic circuit and checking said third output signal to see whether or not the phase difference is continued over at least two clock cycles for producing said jitter detecting signal.

25. The jitter detecting circuit as set forth in claim 24, in which said plural phase difference detectors include delay circuits respectively forming parts of said plural phase difference detectors, selectively connected to said plural state change detectors and introducing delay times different from one another into propagation of said target signal for producing delayed target signals, respectively, and bi-stable circuits respectively forming other parts of said plural phase difference detectors, each of said bi-stable circuits having a signal input node supplied with one of said delayed target signals, a clock input node supplied with said reference clock signal and a signal output node for outputting one of said first output sub-signals.

26. The jitter detecting circuit as set forth in claim 25, in which each of said bi-stable circuits is a flip-flop circuit.

27. The jitter detecting circuit as set forth in claim 26, in which each of said phase differences is equivalent to the sum of the delay time introduced by associated one of said delay circuits and a set-up time of said flip-flop circuit.

28. The jitter detecting circuit as set forth in claim 24, in which said plural state change detectors includes a data storing circuit having a data input node supplied with the first output sub-signal from the associated one of said plural phase difference detectors and a control node supplied with said reference clock signal for storing said first output sub-signal and a signal output node, and an exclusive-OR gate having a first input node supplied with said first output sub-signal and a second input node connected to said signal output node of said bi-stable circuit.

29. The jitter detecting circuit as set forth in claim 28, in which said data storing circuit is a flip-flop circuit.

30. The jitter detecting circuit as set forth in claim 24, in which said judging circuit includes a first flip-flop circuit having a data input node supplied with said third output signal and a clock input node supplied with said reference clock signal for producing a fourth output signal, an inverter supplied with said reference clock signal for producing an inverted reference clock signal, an AND gate supplied with said third output signal and said fourth output signal for producing a fifth output signal, and a second flip-flop circuit having a data input node supplied with said fifth output signal and a clock input node supplied with said inverted reference clock signal for producing said jitter detecting signal.

31. The jitter detector as set forth in claim 1, further comprising another jitter detector supplied with said target clock signal and said reference clock signal as another target clock signal and another reference clock signal and including another phase difference detecting unit similar to said phase difference detecting unit and producing a third output signal changed between said first logic level and said second logic level and another state change detecting unit similar to said state change detecting unit for producing a fourth output signal representative of said cycle-to-cycle jitter.

32. The jitter detecting circuit as set forth in claim 31, in which said another phase difference detecting unit includes other phase difference detectors for producing third output sub-signals forming parts of said third output signal and representative of other phase differences different in amount from one another, and said another state change detecting unit includes other state change detectors selectively connected to said other phase difference detectors for producing fourth output sub-signals forming parts of said fourth output signal on the basis of said third output sub-signals, respectively.

33. The jitter detecting circuit as set forth in claim 32, in which said other phase difference detectors include other delay circuits respectively forming parts of said other phase difference detectors and introducing delay times different from one another into propagation of said another target signal for producing other delayed target signals, respectively, and other bi-stable circuits respectively forming other parts of said other phase difference detectors, each of said other bi-stable circuits having a signal input node supplied with one of said other delayed target signals, a clock input node supplied with said another reference clock signal and a signal output node for outputting one of said third output sub-signals.

34. The jitter detecting circuit as set forth in claim 33, in which each of said other bi-stable circuits is another flip-flop circuit.

35. The jitter detecting circuit as set forth in claim 34, in which each of said phase differences is equivalent to the sum of the delay time introduced by associated one of said other delay circuits and a set-up time of said another flip-flop circuit.

36. The jitter detecting circuit as set forth in claim 32, in which each of said other state change detectors includes another data storing circuit having a data input node supplied with the third output sub-signal from the associated one of said other phase difference detectors and a control node supplied with said another reference clock signal for storing said third output sub-signal and a signal output node, and another exclusive-OR gate having a first input node supplied with said third output sub-signal and a second input node connected to said signal output node of said other bi-stable circuit.

37. The jitter detecting circuit as set forth in claim 36, in which said data storing circuit is a flip-flop circuit.

38. The jitter detecting circuit as set forth in claim 32, in which said another jitter detector further comprises another detecting signal generating circuit having plural input nodes respectively connected to said other state change detectors for receiving said fourth output sub-signals and one of said other phase difference detectors detecting the most serious phase difference for receiving associated one of said third output sub-signals for producing another jitter detecting signal representative of existence of said cycle-to-cycle jitter.

* * * * *